United States Patent [19]

Ichinohe

[11] 4,181,537
[45] Jan. 1, 1980

[54] METHOD OF FABRICATING AN INSULATED GATE FIELD EFFECT DEVICE

[75] Inventor: Eisuke Ichinohe, Katano, Japan

[73] Assignee: Matsushita Electric Industrial Co., Ltd., Kadoma, Japan

[21] Appl. No.: 805,576

[22] Filed: Jun. 10, 1977

[30] Foreign Application Priority Data

Jun. 15, 1976 [JP] Japan .................................. 51-70573

[51] Int. Cl.$^2$ .......................... H01G 7/00; H01L 7/44; H01L 11/14; H01L 29/04
[52] U.S. Cl. ...................................... 148/1.5; 148/187; 29/571; 357/23; 357/59; 427/82; 427/93; 427/38
[58] Field of Search ....................... 427/82, 93; 357/23, 357/59; 148/187, 1.5; 29/571

[56] References Cited

U.S. PATENT DOCUMENTS

| 3,544,858 | 12/1970 | Kooi | 357/23 |
| 3,755,001 | 8/1973 | Kooi | 357/50 |
| 3,936,859 | 2/1976 | Dingwall | 357/23 |
| 3,958,323 | 5/1976 | De La Moneda | 357/23 |

*Primary Examiner*—Michael F. Esposito
*Assistant Examiner*—Richard Bueker
*Attorney, Agent, or Firm*—Wenderoth, Lind & Ponack

[57] ABSTRACT

This invention provides a method of making an improved gate structure in which the gate electrode is self-aligned with respect to the field isolation oxide regions.

Gate constituting layers are formed on a substrate prior to formation of the field isolation oxide regions. An oxidation barrier layer is provided on such layers, also covering the other regions which should be formed into the source and drain regions, etc. By etching off the oxidation barrier layer above the field isolation regions, the boundary edges of the gate on the field isolation regions are formed. Then oxidation is performed using the oxidation barrier as a masking pattern to form the field isolation oxide regions. The field isolation oxide regions and the gate thus formed completely coincide with each other at their boundary edges.

2 Claims, 16 Drawing Figures

METHOD OF FABRICATING AN INSULATED GATE FIELD EFFECT DEVICE

BACKGROUND OF THE INVENTION

This invention relates to the fabrication of an insulated gate field effect device such as a MOSFET, in which the gate electrode is self-aligned with respect to field isolation oxide regions.

Recent developments in the fabrication of MOSFETs have emphasized the need to minimize the size of the drain and source areas.

One consuming feature of the area that the gate electrode must overlap onto the field isolation regions. This overlap has been necessary to achieving misregistration tolerance so as to ensure complete coverage of the channel.

SUMMARY OF THE INVENTION

It is an object of the present invention to provide an improved method of fabricating an insulated gate field effect device in which the gate electrode is self-aligned with respect to the field isolation oxide regions.

It is also an object of the invention to provide a method in which the formation of the device regions other than the gate region is performed rationally in relation to the procedure for accomplishing the above mentioned object.

This invention is embodied in a method wherein the gate constituting layers are formed on the substrate prior to formation of the field isolation oxide regions. The layers include the gate insulating film and the gate electrode. An oxidation barrier layer is provided on these layers, covering also the other regions which should be formed into the source and drain regions, etc.

By etching off at least the oxidation barrier layer above the field isolation oxide regions, the boundary edges of the gate with the field isolation oxide regions are formed. Then oxidation is performed to form the field isolation oxide region using the oxidation barrier as a masking pattern.

The field isolation regions and the gate thus formed completely coincide with each other at their boundary edges.

DETAILED DESCRIPTION

Figure 1A:
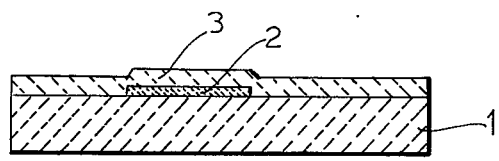
FIG. 1a–1j are cross-sectional views of a semiconductor wafer, illustrating the intermediate stages of a preferred embodiment of the method of fabrication of a MOSFET according to this invention.
Figure 1B:
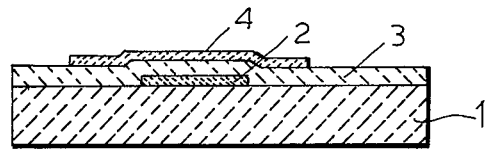
Figure 1C:
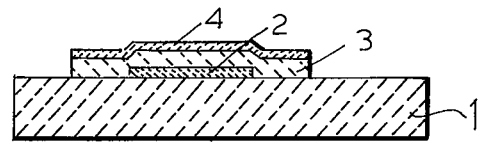

Referring to FIG. 1a, 1 denotes an n-type silicon substrate having the configuration of a wafer, on which a gate oxide film 2 of about 1,000 Å thickness is formed by way of oxidation, masking and etching. A polysilicon layer 3 of about 3,000 Å thickness is then formed over the entire surface of the layer. The polysilicon layer 3 may be of a doped p-type material. Then, a first pattern of an oxidation barrier layer 4 which serves as the mask to prevent oxidation, for example, silicon nitride (about 1,000 Å thick), is formed. In making this pattern of silicon nitride, for example, a silicon nitride layer is deposited on the entire surface and on it is provided a CVD oxide film having a thickness of about 3,000 Å; the pattern of the CVD oxide film is formed by way of masking and etching; the photoresist film is removed; the silicon nitride is etched with hot phosphoric acid ($\simeq 160°$ C.). Then, the CVD oxide film is removed, thereby forming the first pattern of the oxidation barrier layer 4 of silicon nitride (FIG. 1b). This first pattern of the oxidation barrier layer 4 should cover the gate oxide film region as well as the regions to be formed into the source and the drain regions extending only to where these regions will bound the field isolation oxide regions.

Figure 1D:
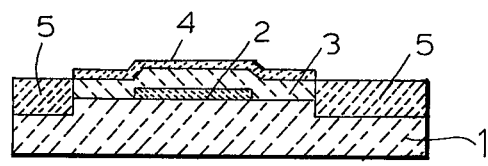
Figure 1E:
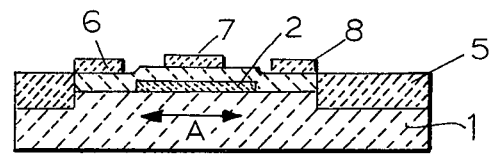

Then, with the first pattern of the silicon nitride 4 as the mask, the polysilicon layer 3 is etched away, and if necessary, a part of the thickness of the silicon wafer 1 (FIG. 1c) is also etched. The depth of etching should be about one half (about 3,000 Å) of the desired thickness (e.g. 6,000 Å) of a field isolation oxide film to be formed later. Then the field isolation oxide film 5 is formed by way of oxidation of the silicon substrate in wet oxygen (FIG. 1d).

Figure 1F:
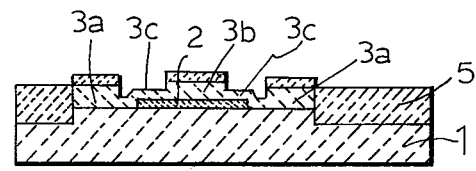

Then, the oxide film (not shown in the drawings) formed on the surface of the silicon nitride 4 is removed; a photoresist film pattern (not shown in the drawings) is formed; with that photoresist film pattern as a mask, plasma etching with $CF_4$ as a main constituent is performed to form a second pattern of silicon nitride parts 6,7,8 (FIG. 1e); and thereafter, the exposed polysilicon layer 3 is etched to about half of its thickness, thereby forming the thick parts 3a, 3b and the thin part 3c (FIG. 1f). At this time, since the gate width (dimensions perpendicular to the illustrated section) has already been determined by the silicon nitride pattern in the step of FIG. 1b, it is proper to specify only the length (dimensions in the direction directed by an arrow A). The etching of the silicon nitride 4 for the formation of the second pattern may be made with a CVD oxide film pattern as the mask. The advantage thereof is that because the etching rate for the p-doped CVD-oxide-film is much higher than that for the thermally oxidized film, the thickness of the field oxide film diminishes relatively slightly. Following this step, the polysilicon layer 3 may be further etched.

Figure 1G:
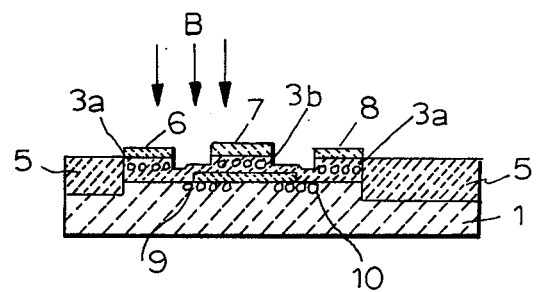

Thereafter, through the thinned-out polysilicon layer 3c and part of the gate oxide film 2, a p-type impurity (e.g. boron ions) B is implanted into the silicon wafer 1, thereby forming the source and the drain regions 9, 10 (FIG. 1g).

At this time, boron ions are also implanted into the polysilicon layer parts 3a, 3b through the silicon nitride parts 6, 7 and 8. The depth to which the boron ions are diffused is determined by the acceleration energy of the ions, and the requirement that the ions should not reach the silicon wafer through the field oxide film 5 or through the gate oxide film 2. If the polysilicon 3 is doped so as to be a p-type material, it is not particularly necessary to implant boron into the polysilicon layer parts 3a and 3b.

Figure 1H:
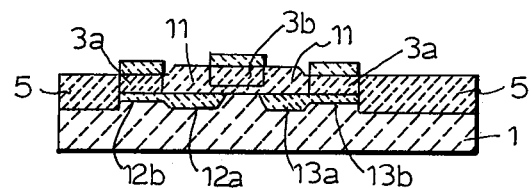

Then, by an oxidation step, the thinned-out polysilicon layer 3c is turned into an oxide film 11 (FIG. 1h). By this oxidation step, the implanted boron is annealed, forming the source and the drain layers 12a and 13a, and the boron implanted into the polysilicon layer parts 3a and 3b or the impurity in the polysilicon doped to be p-type material is diffused to form the source and the drain contact layers 12b and 13b.

Figure 1I:
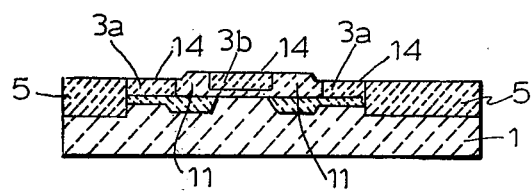

Then, the oxide film (not shown in the drawings) of silicon nitride formed by the oxidation step and the second pattern of the silicon nitride 6, 7 and 8 are removed (FIG. 1i). As the second pattern 6, 7 and 8 is thus removed, the surfaces 14 of the polysilicon layer parts 3a and 3b are exposed in a nearly flat state.

Figure 1J:
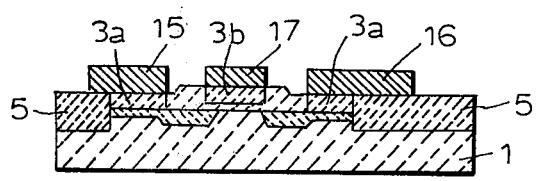

Then, as the electrode metal, aluminum for example (about 5,000 Å thick) is vapor-deposited, and by way of masking and etching, the source and the drain electrodes 15 and 16 and the gate electrode 17 are formed (FIG. 1j).

Figure 2:
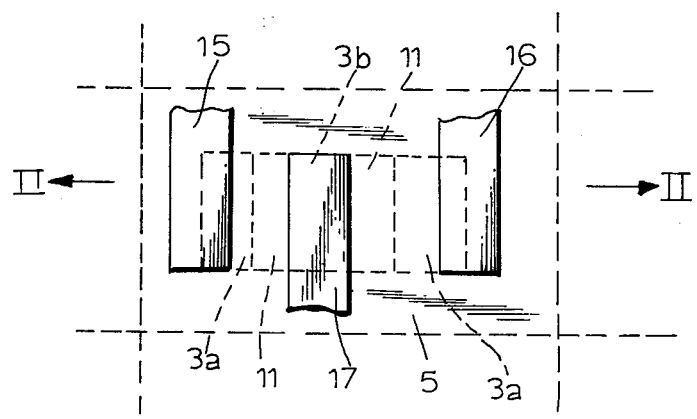
FIG. 2 is a plan view of the wafer of FIG. 1j.

FIG. 2 is a top plan view of the structure shown in FIG. 1j. FIG. 1j is the sectional view taken along the line II—II of FIG. 2. The gate electrode 3b of the polysilicon layer is self aligned with respect to the field isolation oxide region 5 without straddling the field isolation oxide region 5.

It is to be noted that though the impurity is diffused from the polysilicon layer into the semiconductor substrate at the source and the drain regions according to the above described embodiment, the impurity may be introduced into the semiconductor wafer preliminarily.

In the following, the second embodiment of this invention in which a multi-layer wiring construction is produced is described with reference to FIG. 3a-3d. In this embodiment, the steps of FIG. 1a-1i are followed in the same way as in the aforementioned embodiment. The following steps are illustrated in FIGS. 3a-3d.

Figure 3A:
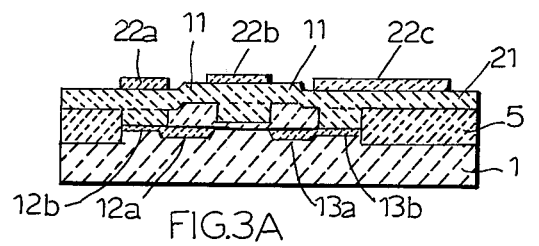
FIG. 3a–3d are cross-sectional views of a semiconductor wafer, illustrating the intermediate stages of another embodiment of the method of this invention.

Thus, after the step of FIG. 1i, the second polysilicon layer 21 is formed, and a p-type impurity is diffused (FIG. 3a). This may be done by formation of a polysilicon layer doped with boron. Then, the silicon nitride pattern 22 including pattern parts 22a-22c of about 1,000 Å thickness is formed. With the silicon nitride parts 22a-22c as the mask, the polysilicon layer 21 is etched, thereby forming thin part 23 of about one half of its original thickness (about 1,500 Å) (FIG. 3b).

Figure 3B:
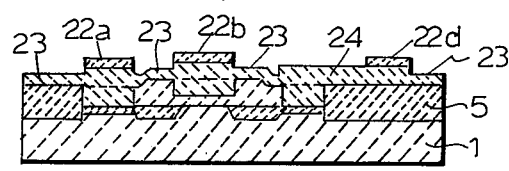

Then, by way of masking and etching, parts of the silicon nitride pattern parts 22c are selectively removed to form a secondary pattern 22d (FIG. 3b). As a result, the thickness of polysilicon layer 21 is reduced as at 23, the thick parts being covered by the silicon nitride 22a, 22b, 22d and the thick part 24 being exposed.

Figure 3C:
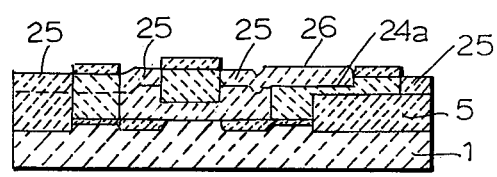

Then, an oxidation step is preformed, to turn the exposed portion of polysilicon layer into the oxide film 25 and 26. At this time, a part of the polysilicon layer 24 is left as a conductive layer (FIG. 3c).

Figure 3D:
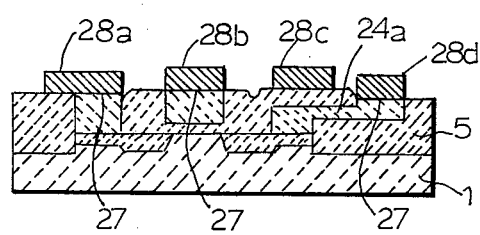

Then, the silicon nitride is removed, to expose the contact surface 27 in a nearly flat state (FIG. 3d).

Figure 4:
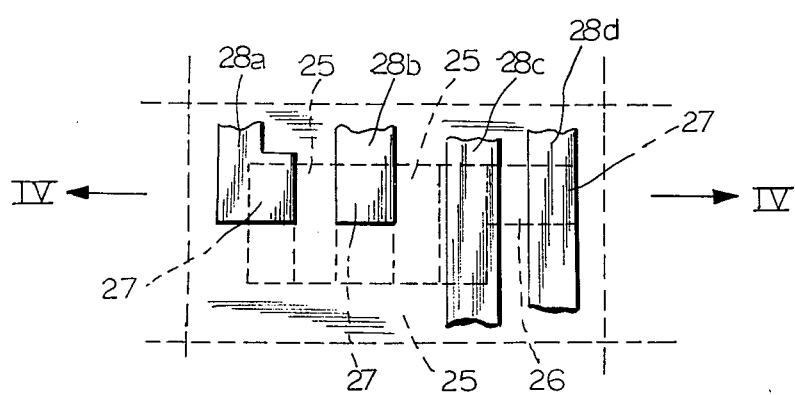
FIG. 4 is a plan view of the wafer of FIG. 3d.

Then, as the electrode metal, aluminum (about 5,000 Å thick) is vapor-deposited, and by way of masking and etching, the electrodes 28a-28d are formed (FIG. 3d). The numeral 28c represents the wiring, for example, to another transistor, which is intersecting the lead-out part 24a of the polysilicon layer to the drain electrode 28d. FIG. 4 gives a schematic plan view of the construction of FIG. 3d. FIG. 3d shows the sectional view taken along the line IV—IV of FIG. 4.

What is claimed is:

1. A method of fabricating an insulated gate field effect device having a polycrystalline silicon gate, with a silicon substrate of a first conductivity type having deposited therein source and drain regions of a second conductivity type, with a gate insulator layer and a polycrystalline silicon layer sequentially formed on the surface of said substrate defining a gate region between said source and drain regions, with interconnection layers of polycrystalline silicon contacting the source and drain regions, and with a field isolating region surrounding said source, gate and drain regions, comprising the steps of:

forming a gate insulator layer on the surface of a semiconductor substrate;

depositing a polycrystalline silicon layer on the surface of the semiconductor substrate covering at least said gate insulator layer and the regions to be formed into the source and drain regions;

forming an oxidation barrier layer in a first pattern covering said gate insulator layer and the regions to be formed into the source and drain regions, and extending only to the edge of the gate insulator layer at the regions where the gate is bounded by the field isolation regions;

selectively removing a part of the polycrystalline silicon layer by using said first pattern of the oxidation barrier layer as a masking pattern to prevent removal of the polycrystalline silicon layer thereunder;

oxidizing the substrate to form the field isolation regions by using said first pattern of the oxidation barrier layer as a masking pattern to prevent oxidation of the substrate thereunder;

forming a second pattern of the oxidation barrier layer by selectively removing portions of said oxidation barrier layer above the regions to be formed into the source and drain regions;

forming source and drain regions within the semiconductor substrate through said portions where said oxidation barrier layer has been removed;

selectively oxidizing parts of said polycrystalline silicon layer with said second pattern of the oxidation barrier layer as a masking pattern to prevent oxidation of the polycrystalline silicon layer thereunder, to form isolating layers to electrically insulate the thus distinguished polycrystalline silicon layers from each other and to construct a gate electrode and interconnection layers contacting the source and the drain regions, respectively;

removing the oxidation barrier layer; and providing an interconnection pattern for contacting the gate electrode and the interconnection layers, respectively.

2. A method as claimed in claim 1 wherein:

said source and drain regions are formed within the substrate by implanting an appropriate impurity through said second pattern of the oxidation barrier layers, prior to selectively oxidizing parts of said polycrystalline silicon layer, and annealing said implanted impurity by said selectively oxidizing step.

* * * * *